United States Patent

Inagaki et al.

[11] Patent Number: 5,940,875
[45] Date of Patent: Aug. 17, 1999

[54] ADDRESS PATTERN GENERATOR FOR BURST ADDRESS ACCESS OF AN SDRAM

[75] Inventors: Toru Inagaki, Hanyu; Kenichi Fujisaki, Gyoda, both of Japan

[73] Assignee: Advantest Corp., Tokyo, Japan

[21] Appl. No.: 09/016,710

[22] Filed: Jan. 30, 1998

Related U.S. Application Data

[63] Continuation of application No. 08/517,271, Aug. 22, 1995, Pat. No. 5,835,969.

[30] Foreign Application Priority Data

Aug. 22, 1994 [JP] Japan .................................. 6-220979

[51] Int. Cl.[6] ................................................ G01K 31/28
[52] U.S. Cl. ...................... 711/217; 711/200; 711/105; 711/218; 714/718; 714/719; 714/742; 714/743
[58] Field of Search ................................... 711/200, 217, 711/105, 218; 714/718, 719, 742, 743

[56] References Cited

U.S. PATENT DOCUMENTS

| | | | |
|---|---|---|---|
| 4,958,345 | 9/1990 | Fujisaki | 371/21.3 |
| 4,958,346 | 9/1990 | Fujisaki | 371/21.3 |
| 5,384,745 | 1/1995 | Konishi et al. | 365/230.03 |
| 5,410,687 | 4/1995 | Fujisaki et al. | 365/201 |
| 5,412,793 | 5/1995 | Kreifels et al. | 711/101 |
| 5,450,364 | 9/1995 | Stephens, Jr. et al. | 365/222 |
| 5,481,671 | 1/1996 | Fujisaki | 395/182.06 |
| 5,511,029 | 4/1996 | Sawada et al. | 365/201 |
| 5,835,969 | 11/1998 | Inagaki et al. | 711/217 |
| 5,854,801 | 12/1998 | Yamada et al. | 714/718 |

*Primary Examiner*—Eddie P. Chan
*Assistant Examiner*—Than V. Nguyen
*Attorney, Agent, or Firm*—Muramatsu & Associates

[57] ABSTRACT

An address pattern generator for testing a semiconductor device, particularly, a synchronous DRAM (SDRAM) is disclosed. The address pattern generator can switch an interleave mode and a sequential mode of address generation for a SDRAM during a test process in real time and generates column addresses for the SDRAM by a Y address generation section alone. The address generator includes an address selector that selects and outputs from a lower Y address signal, a Z address signal, and an operation mode control signal, a conversion memory that outputs data based on a conversion table, a multiplexer that selects and outputs an output from the conversion memory and the lower Y address signal in accordance with a burst length control signal. In another aspect, the address pattern generator includes a counter that loads the lower address signal from the Y address generator section for the sequential mode while a fixed value for the interleave mode, an exclusive OR gate that receives an output signal of the counter to an input terminal and the lower address signal from the Y address generation section to the other input terminal, and a multiplexer that selects the output signal of the counter for the sequential mode and the output signal of the exclusive OR gate for the interleave mode.

5 Claims, 8 Drawing Sheets

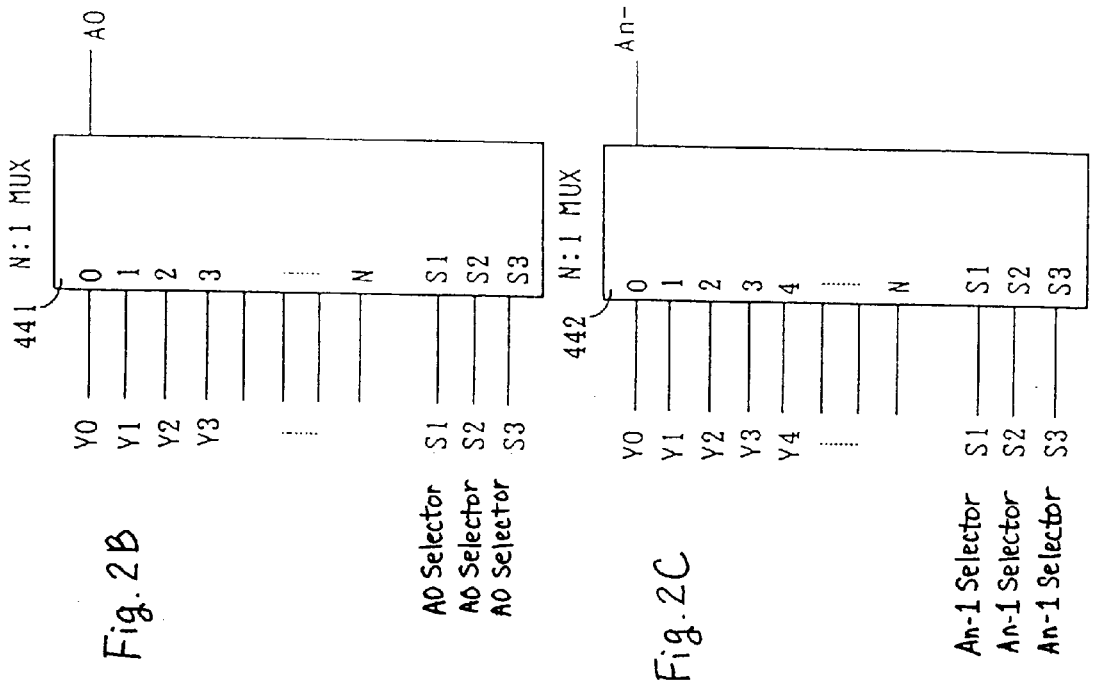
Fig. 2B
Fig. 2C
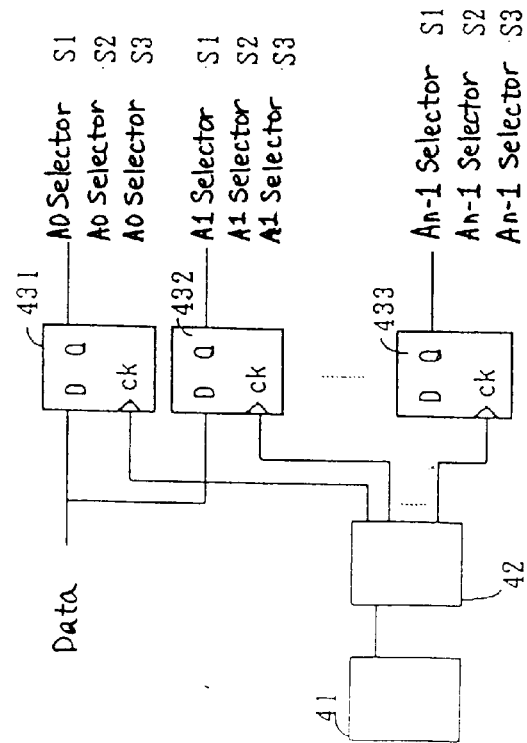
Fig. 2A

Burst Length = 2

Burst Address (B0)

Burst Length = 4

Burst Address (B0-B1)

Burst Length = 8

Burst Address (B0-B2)

Column Address

Fig. 7

ADDRESS PATTERN GENERATOR FOR BURST ADDRESS ACCESS OF AN SDRAM

This is a continuation of U.S. patent application Ser. No. 08/517,271, filed on Aug. 22, 1995, now U.S. Pat. No. 5,835,969.

FIELD OF THE INVENTION

This invention relates to a test pattern generator that test semiconductor devices, especially related to an address pattern generator for generating an address pattern for a burst transfer operation of a synchronous DRAM.

BACKGROUND OF THE INVENTION

In general, a semiconductor test system is used to test various semiconductor devices such as a semiconductor memory. For this purpose, a semiconductor test system generates test patterns to apply the test pattern to a device under test. The devices to be tested are becoming to operate at higher speeds, and one of them is a synchronous DRAM.

A synchronous DRAM (SDRAM), unlike a conventional DRAM, is a memory that makes a continuous access of the certain range of addresses possible by itself at high speed by having a special architecture for the continuous access, thus increasing the overall speed of address access. In a typical SDRAM, a read/write rate of 100 Mbytes/sec or greater is possible. For increasing the rate of the continuous access with high speed like this, the read/write of SDRAM is performed in a burst mode. The burst mode is a mode of address access in a memory where data in the same row addresses are read or written continuously by a block of 2, 4, or 8 words or the like. In addition, the access for such words in the block is made by simply providing a start address of the block. Afterward, the remaining addresses are generated automatically in the SDRAM by itself in accordance with its operation mode, i.e., a burst transfer mode, which results in a high speed operation.

An SDRAM has the following characteristics:

(1) Its inside is divided into two banks and the high speed access is made possible by switching the banks.

(2) The addressing and length of a burst during the burst transfer can be switched by a mode register.

(3) The address and data are synchronized with a clock signal.

In addition, there are two methods for the address sequence of the burst transfer; a sequential mode and an interleave mode, which are determined by an address sequence from a CPU. Addresses start address for each burst address sequence method are generated by the following manners in the inside of the SDRAM.

In the sequential mode, the addresses are generated by addition of the burst start address and an output of an internal counter.

Whereas in the interleave mode, the addresses are generated by an exclusive OR of the burst start address and an output of an internal counter.

As a test pattern generator for this type of SDRAM, an example of technology is disclosed in Japanese Patent Application No. 6-73893 Japanese Patent Laid Open Publication No. 7-262799). This technology provides a test pattern generation system for a SDRAM and its method that generates a test pattern for a SDRAM by arranging a dedicated wrap conversion section or providing a method for converting to the wrap addresses. For this purpose, the system is composed of a wrap conversion means which receives two kinds of input data from the pattern generator and outputs the data by converting the data based on predetermined logical circuit information. In addition, the test pattern generation method for an SDRAM in this conventional technology is composed by inputting column address data (for example, Y0-Y2) and a wrap address (for example, Z0-Z2), and outputting an address by converting the column address data and wrap addresses by a predetermined logical formula.

Generally, in order to perform a failure analysis of the internal cell of a device to be tested, it must generate not only an address provided to the memory to be tested, but also addresses for the burst addresses automatically generated in the memory to be tested.

FIG. 8A–8B illustrates the address generation method of the sequential mode and differences in designation of the column addresses by a difference in the burst length in the conventional semiconductor memory test system. The burst address is generated by storing the burst start address in an initial value storage register 31 of Z address and incrementing the start address by an address operation section 32 of Z address. The column address is generated such that Z address (burst addresses) are inserted into the Y address by a formatter 35. The row address is generated by an X address generation section 10. In this way, the testing is performed by assigning the column address by the formatter. Hence, when changing the setting of the burst length, the address assignments for the entire column addresses must be reset. Since the resetting can be done by the formatter during testing, it has a shortcoming of not being able to change the burst length in real time during testing.

FIG. 9 illustrates an address generation method of the interleave mode. A Y address generation section 20 is composed of initial value registers 211, 212, an address operation section 22 and an arithmetic logical operation section 23. In this case, the burst address is generated by executing an exclusive OR of the arithmetic logical operation section 23 of address generator. The burst start address is set in the register 211. The internal counter address of SDRAM is generated by loading the initial value 0 into the register 212 and incrementing the initial value in the operation section 22. The burst address is generated by taking an exclusive OR of the operation section 22 and register 211 in the arithmetic logical operation section 23.

In the aforementioned test methods, the sequential mode and interleave mode must have separate patterns for testing. Hence, the pattern generation for testing presents a problem of becoming cumbersome. This kind of traditional address generators have shortcomings of not being able to change the burst length in real time during testing and change the operation modes of the sequential mode and interleave mode in real time during testing.

SUMMARY OF THE INVENTION

The first objective of this invention is to provide an address generator that can eliminate these shortcomings, switch the burst length of a burst transfer for SDRAM and switch the interleave mode and sequential mode during testing. Furthermore, the second objective is to provide an address generator that generates column addresses by the Y address generation section alone instead of the two (Y and Z) address generator sections.

The first embodiment by this invention is composed as follows:

The address pattern generator for testing devices to be measured includes: an address selector 40 consisting of n bits that selects and outputs from a lower Y address signal (for example, Y0–Y2) from the Y address generation section 20, Z address signal (for example, Z0–Z2) from a Z address generation section 30, and an operation mode control signal (for example, C0) from an instruction memory 90; a conversion memory 50 that outputs constant conversion table contents by the output of the n bits address selector 40 an address signal; a multiplexer 60 that selects and outputs the burst address (for example, B0-2) for each bit, which is an output from the conversion memory 50, and a lower address signal (for example, Y0-2) from the Y address generation 20 in accordance with the burst length control signal (for example, BS0-2).

In addition, the second embodiment of this invention is composed as follows:

The address pattern generator for testing devices includes: a counter 91 that loads a lower address signal (for example, Y0-2) from the Y address generator section 20 for the sequential mode and loads a fixed value (#0) for the interleave mode by a control signal from the instruction memory 90; an exclusive OR gate 93 that provides an output signal of the counter 91 to an input terminal 1 and the lower address signal (for example, Y0-2) from the Y address generation section 20 to the other input terminal; a multiplexer 94 that selects the output signal of the counter 91 for the sequential mode and the output signal of the exclusive OR gate 93 for the interleave mode by the control signal from the instruction memory 90; a multiplexer 95 that selects the output signal of the multiplexer 94 when the data bit is 1 and the lower Y address signal from the Y address generation section 20 when the data bit is 0.

In accordance with the first embodiment of this invention, as the conversion data for the maximum burst length is set in the conversion memory, by controlling the instruction memory arbitrarily during testing, which changes the setting of the register 70 for control, it is achieved the conversion of the burst length. In addition, in the first embodiment, because a difference in the burst address generation section between the sequential mode and interleave mode is made by the conversion memory 50, programs for generating test addresses for the burst address of the sequential mode and interleave mode can be shared.

Furthermore, in accordance with the second embodiment of this invention, SDRAM loads the lower Y address signal to the counter 91 for the sequential mode and loads (#0) for the interleave mode in synchronizing with timing which sets /CAS (column address strobe), which is applied to SDRAM, to a low level by the control signal of the instruction memory 90. Note that the actual timing relation is generated based on the output signal from the memory to be measured. The counter 91 in the address generator increments by one in synchronizing with SDRAM, which generates the burst address in itself by the clock input. This increment of one results in the insertion of a burst address in the lower Y address identical to one generated in SDRAM. In addition, when changing the burst length for the SDRAM during testing, data which specifies the same burst length in the address generator is set. In this way, when changing the burst type for SDRAM during testing, switching between the type of the sequential mode and interleave mode is carried out by switching the select signal of the multiplexer 94 of the address generator by the control signal from the instruction memory 90. Therefore, the burst type and burst length can be changed arbitrarily during the tests of SDRAM. In addition, as the column address is generated by one of the Y address generation section 20, the program writing for the address generation becomes simpler than the conventional two (Y and Z) address generation sections.

BRIEF DESCRIPTION OF THE DRAWINGS

FIG. 2A–2C illustrates an example of assigning the address selection at the address selector 40.

Figure 7:
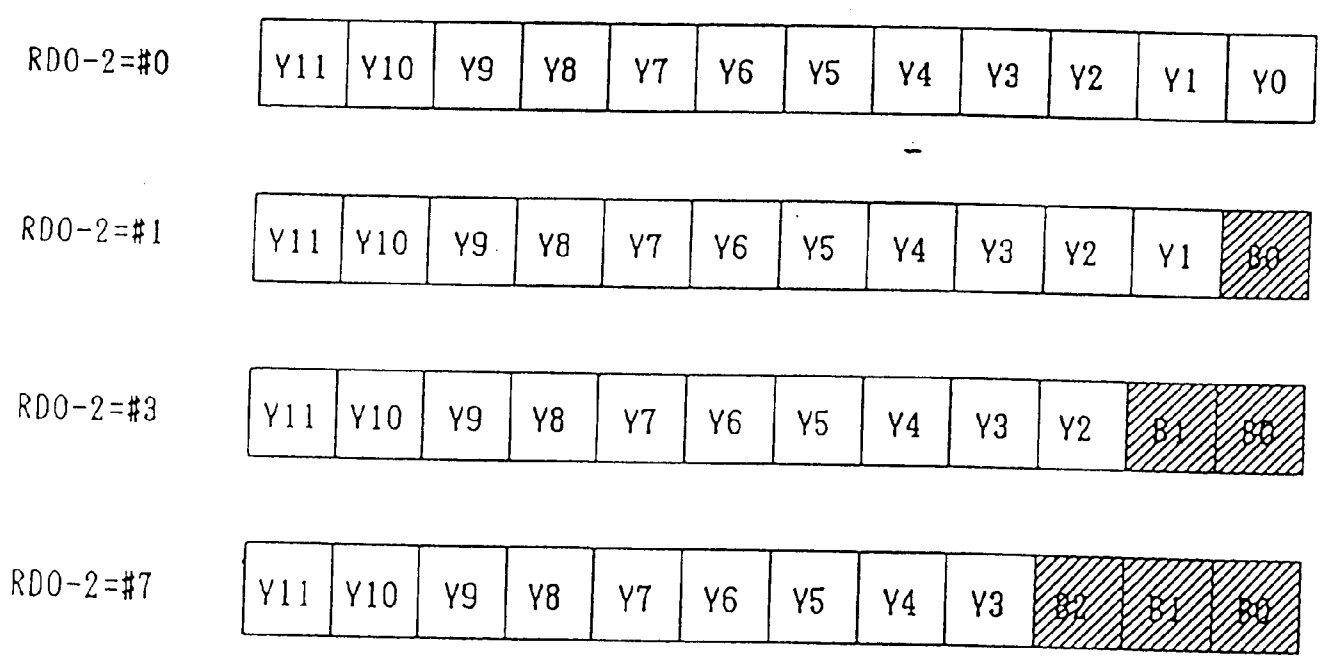

FIG. 7 shows a relation of the burst address bit (B0-B2) being inserted to the Y address bit.

DETAILED DESCRIPTION OF THE PREFERRED EMBODIMENT

Figure 1:
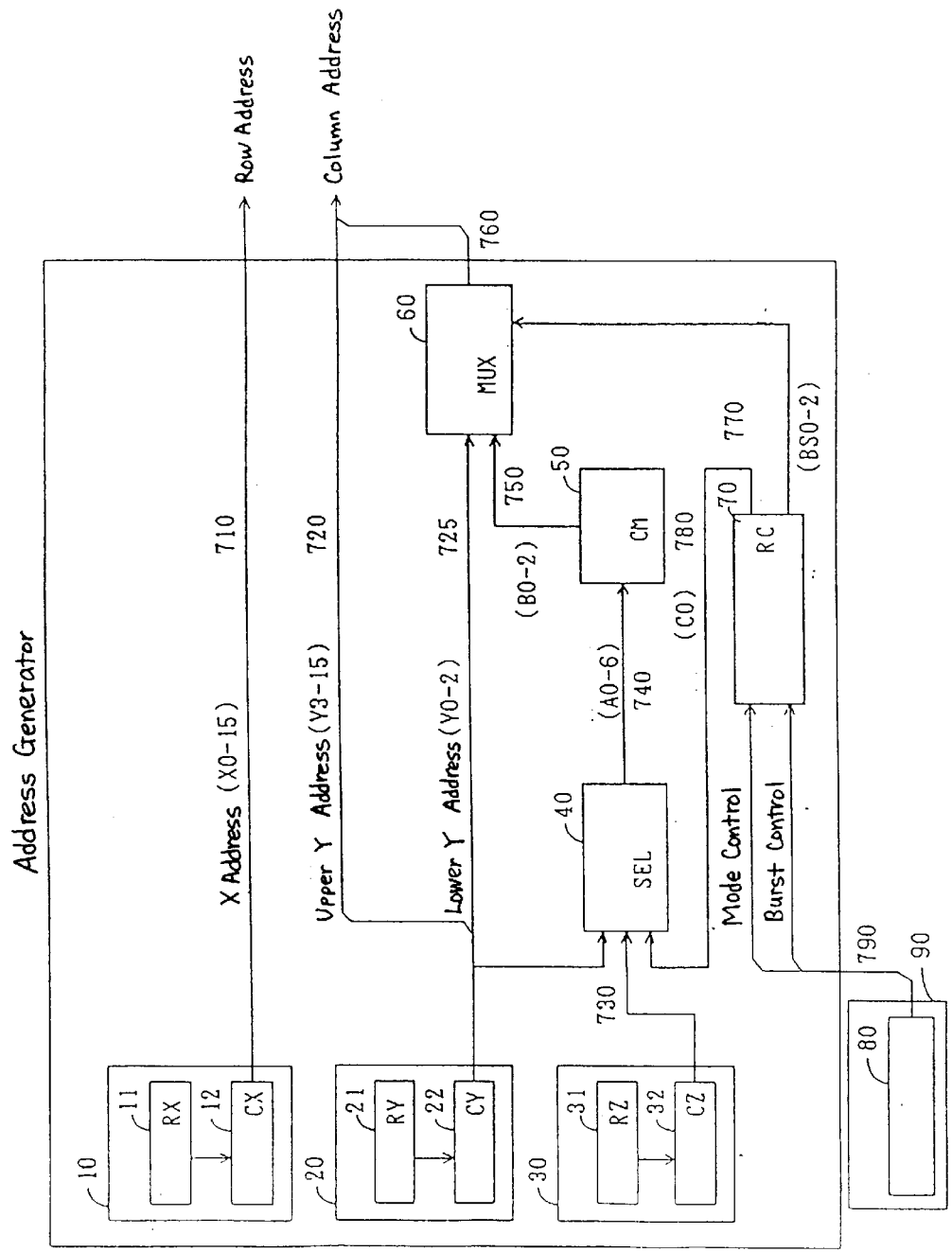
FIG. 1 is a block diagram of the address pattern generation illustrating the first embodiment of this invention.

The present invention is described by referring to the drawings. FIG. 1 is a block diagram of the address pattern generation illustrating the first embodiment of the present invention.

As shown in FIG. 1, the address pattern generator is includes the address selection 40, conversion memory 50, multiplexer 60 and register 70 for control. The burst start address is generated in the Y address generation section 20 and the internal count address is generated in the Z address generation section 30.

FIG. 2A–2C illustrates an example of assigning the address selection at the address selector 40. The address selector 40 is composed of an address pointer 41, decoder 42, registers (431, 432, 433) and multiplexers (441, 442). The registers (431, 432, 433) have the same number of bits (n) as the number of the address bits of the conversion memory 50, and select the conversion memory address bits output from the address pointer 41 and decoder 42, and store the selector data in the registers (431, 432, 433). The conversion memory address is selected from the Y and Z addresses, and the like, by selected signals (S1, S2, S3) from the corresponding registers (431, 432, 433).

Figure 3:
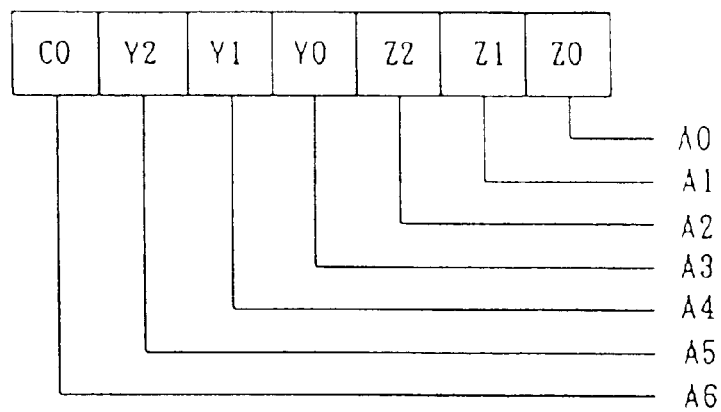
FIG. 3 is an example of the address assignments of the conversion memory 50.

FIG. 3 is an example of the address assignments of the conversion memory 50. In this example, the conversion memory address (n) consists of 7 bits. Hence, the multiplexer (441, 442) is composed of 7 multiplexer units. In this example, the operation mode control signal, which switches the sequential mode and interleave mode, is assigned in addition to the Y and Z addresses. Said operation mode control signal 780 (for example, C0) is supplied from the control register 70. Note that the address selection data of the conversion memory 50 is preset in the register prior to the testing.

The address sequences for the maximum burst length of each sequential mode and interleave mode are stored in separate addresses of the conversion memory 50 in advance. For example, when there are burst lengths of 2, 4 and 8, the generation patterns of the sequential mode and interleave mode for burst length of 8 are stored in the memory 50.

In addition, the burst length of 4 in the burst length of 8 is identical to the sequence of the lower 2 bits when considered by a binary system. Similarly, the burst length of 2 is identical to the sequence of the lower 1 bit when considered in a binary system in the burst length of 8. Hence, the address conversion is made possible by storing the address sequence of the maximum burst length in the conversion memory 50 and changing the control bit length.

FIG. 3 illustrates an example of the burst address generation which was converted in accordance with the burst address (Y0-Y2), counter address (Z0-Z2) and operation mode control signal (C0) in the conversion memory 50. For example, in the sequential mode (the operation mode control signal C0=0), when the burst address Y0-Y2=0, desirable generation data is stored in the conversion memory address A0-A6=0 if the counter address Z0-Z2=0. Similarly, conversion data for the interleave mode (the operation mode control signal C0=1) is also stored in the conversion memory 50. When the conversion memory is accessed by these addresses (Y0-Y2, Z0-Z2, C0) during the tests of SDRAM, the retrieved data of the conversion memory is output as the burst address. In this way, the burst address generation for the sequential mode and interleave mode is made possible.

The register 70 latches the operation mode control data and the burst length control data which are described in the address operation area of the instruction memory 90. The reason for having the register is that as long as the setting of the operation mode and burst length is not switched in the instruction memory, the testing is possible with the same setting, and it has an advantage of eliminating the repeated description of the operation mode for all the cycles. As the operation mode control signal 780 (for example, C0) among the outputs of the register 70 is provided to the address selector 40, the sequential mode and interleave mode can be switched arbitrarily during testing.

Figure 4:
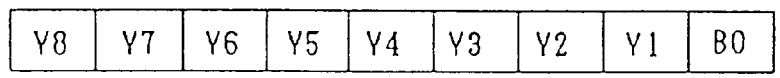
FIG. 4 shows a relation of the burst length for the column address bits.
Figure 4:
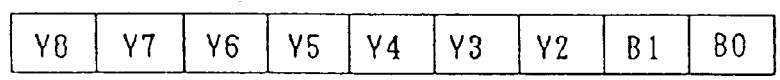
Figure 4:
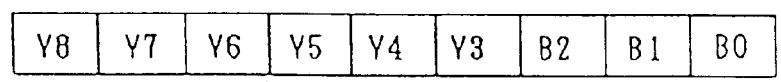

FIG. 4 shows a relation of the burst length to the column address bits. The control is carried out such that the burst length control signal 770 (for example, BS0-BS2), which is an output of the control register 70, is provided to the multiplexer 60 and the lower 3 bits of the column address switches the Y address (Y0-Y2) and the burst address (B0-B2) from the conversion memory 50 for each bit by this control signal (BS0-BS2).

Figure 5:
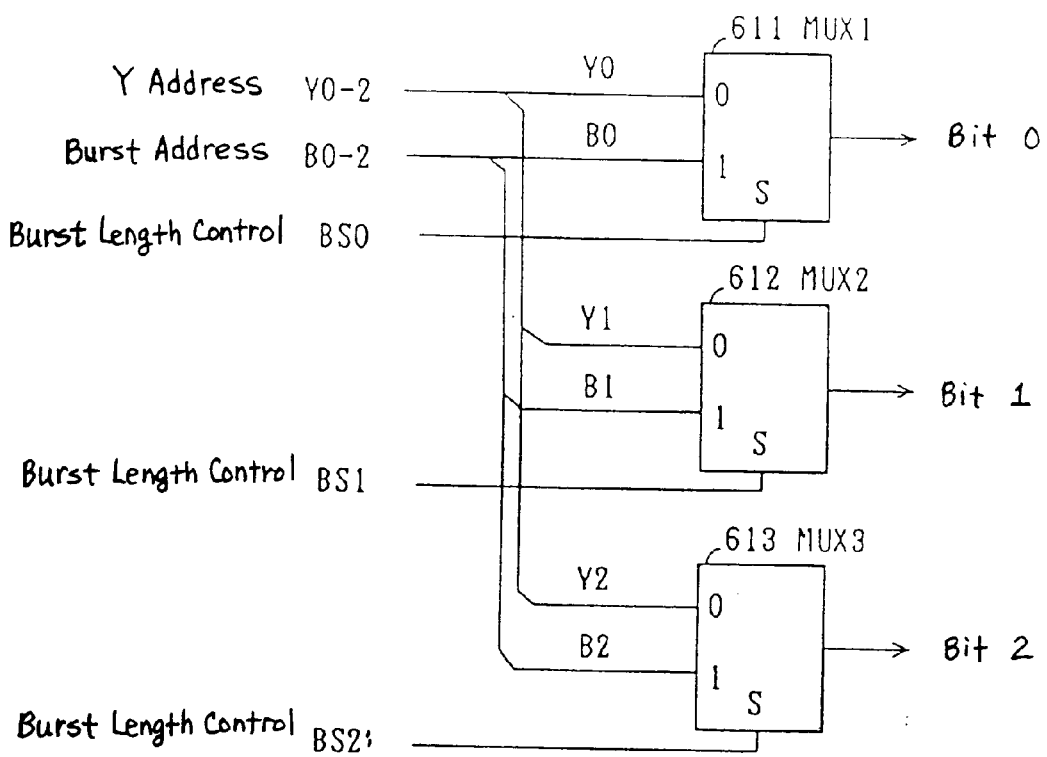
FIG. 5 illustrates a composition example of the multiplexer 60.

FIG. 5 illustrates a composition example of the multiplexer 60. The operation is such that when the burst length is 8, the burst address B0-B2 is selected by setting the 3 bits of BS0-BS2 to all 1. When the burst length is 4, the column address bits 0, 1, 2 selects the burst address B0, B1, and Y2 of the Y address, respectively by setting BS2, BS1, and BS0 to 0, 1, 1, respectively. Similarly, when the burst length is 2, the column address bits 0, 1, 2 selects the burst address B0, Y1 of the Y address, and Y2 of the Y address, respectively by setting BS2, BS1, and BS0 to 0, 0, 1, respectively.

In the foregoing, as the conversion data for the maximum burst length is set in the conversion memory, by controlling the instruction memory arbitrarily during testing, which changes the setting of the register 70 for control, it is achieved the conversion of the burst length. In addition, in the first embodiment, because the difference in the burst address generation section between the sequential mode and interleave mode is made by the conversion memory 50, programs for generating test addresses for the burst address of the sequential mode and interleave mode can be shared. That is, separate programs for each mode are no longer necessary.

The second embodiment of this invention is explained by referring to the figures.

Figure 6:
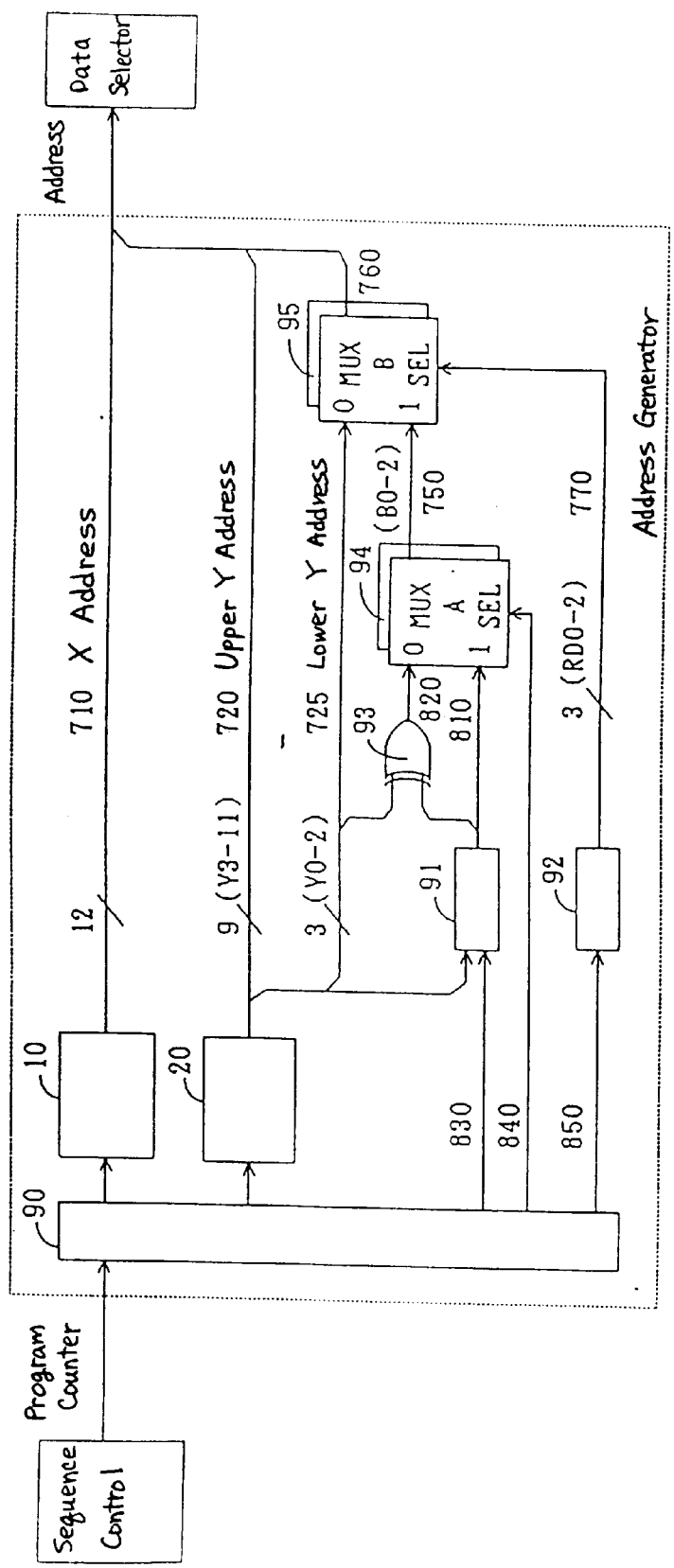
FIG. 6 is a block diagram of the address pattern generator by the second embodiment.
Figure 8A:
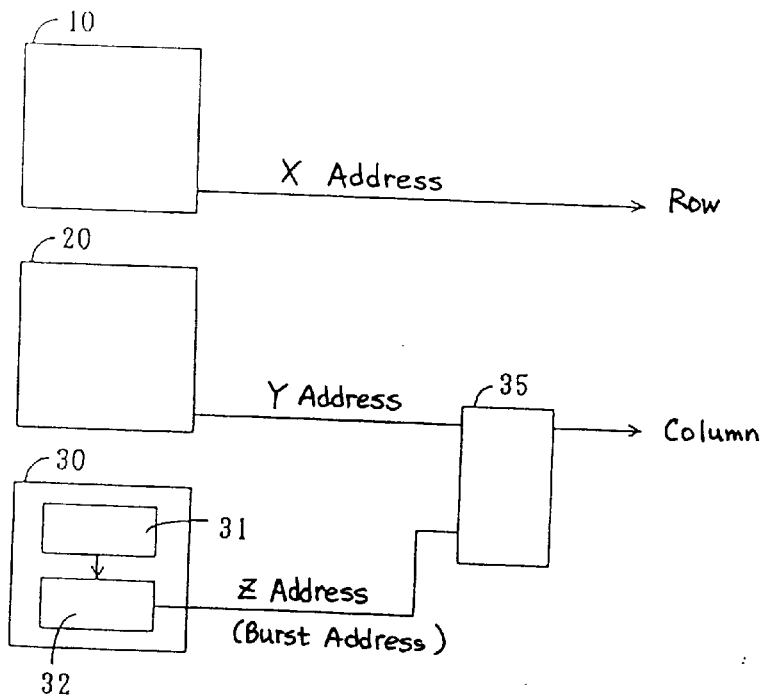
FIG. 8A–8B shows an address generation method of the sequential mode in the conventional semiconductor memory test system and a difference of the column address assignments due to the difference of the burst lengths.
Figure 8B:
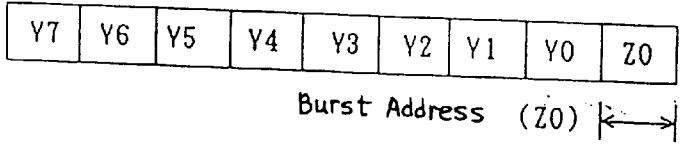
Figure 8B:
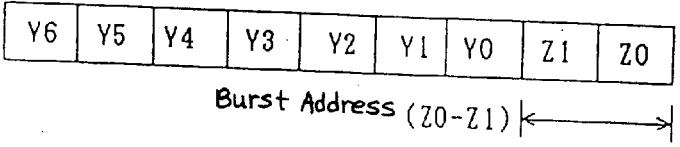
Figure 8B:
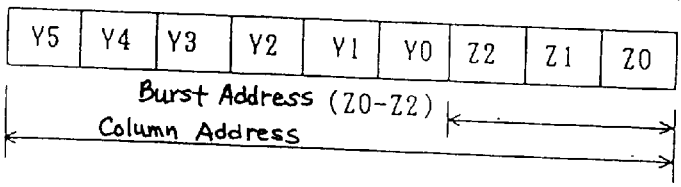
Figure 9:
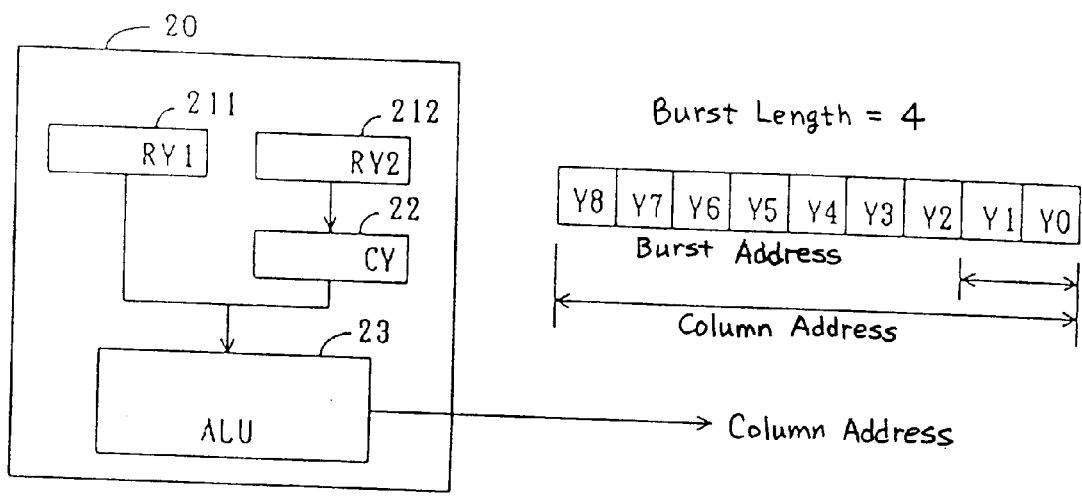
FIG. 9 shows an address generation method of the interleave mode.

In the above first embodiment, the address sequence is stored as the conversion table in the conversion memory 50 and generated therefrom. However, this conversion section can be composed as follows:

FIG. 6 is a block diagram of the address pattern generator by the second embodiment. FIG. 7 shows a relation of the burst address bit (B0-B2) to be inserted in the Y address bit.

As shown in FIG. 6, a counter 91 consists of 3 bits in this example. For the sequential mode, the lower Y address signal 725 (Y0-Y2) from the Y address generation section 20 is loaded by the control signal from the instruction memory 90. For the interleave mode, (0#) is loaded regardless of the Y address signal. After loading, the counter 91 is incremented by one in synchronizing with the operation of SDRAM.

The multiplexer 94 selects a signal from the counter 91 in the sequential mode and selects a signal from the exclusive OR gate 93 in the interleave mode by the control signal from the instruction memory 90 and outputs the selected signal as the burst address 750 (B0-B2).

In this example, the register 92 consists of 3 bits and a value for the register 92 is set by the control signal from the instruction memory 90, for example, an output 770 (for example, RD0-RD2) is connected to the input of the multiplexer 95 in a bit-to-bit basis.

The multiplexer 95 selects a signal on from the multiplexer 94 when the data bit of the register 92 is 1 while it selects a signal from the Y address generation section 20 when it is 0. In this way, the insertion of the Y address bits is performed in the register 92 and multiplexer 95 as shown in FIG. 7.

The operation of the second embodiment is performed as follows. When starting the SDRAM testing and setting the burst type in the internal mode register of SDRAM, a switching command is stored in the instruction memory 90 in the address generation.

Next, the lower Y address signal is loaded to the counter 91 for the sequential mode and data #0 is loaded in the counter 91 for the interleave mode in synchronizing with timing which sets /CAS to a low level, which is impressed to SDRAM, by the control signal of the instruction memory 90. Note that the actual timing relation is a relation where a signal from the pattern generator is applied to SDRAM, however, as it is easier to understand by paying attention to the operation of SDRAM, it mainly express the operation of SDRAM. This will be the same in the following.

The counter 91 in the address generator increments by one in synchronizing with SDRAM, which generates the burst address in itself by the clock input. This increment of one results in the insertion of a burst address in the lower Y address identical to that generated in SDRAM.

In addition, when changing the burst length in the SDRAM during testing, data which specifies the same burst length is set in the register 92 of the address generator. For example, when changing the burst length from 8 words to 4 words, the output 750 of the multiplexer 94 does not change (for example, B0-B2), but Y2 instead of B2 is output at the column address bit 2 and the burst address (B0-B1) becomes 2 bits.

When changing the burst type on the SDRAM during testing, the type of the sequential mode and interleave mode are charged switching the select signal of the multiplexer 94 of the address generator by the control signal 840 from the instruction memory 90.

Therefore, the burst type and burst length can be changed arbitrarily during the tests of SDRAMs. In addition, as the column address is generated only by the Y address generation section 20, the program writing for the address generation becomes easier than the conventional example using the two (Y and Z) address generation sections.

Note that in the above each embodiment, it explained for the case of up to the burst length of 8 words. However, it can deal with entire words by expanding the counter, register, multiplexer, etc. to a necessary number of bits.

Because the first and second embodiments are composed as described above, it has the following effects. The address generator can switch the burst length of the burst transfer of SDRAM during testing, and can switch the sequential mode and interleave mode during testing. In addition, the address generator is capable of generating the column address with the Y address generation section alone instead of the two Y and Z address generation sections.

We claim:

1. An address pattern generator used for testing a semiconductor device and for changing modes of address generation for said device in real time, comprising:

a counter (91) that loads a lower address signal (725) from a Y address generator section (20) in a sequential mode and loads a fixed value (#0) in an interleave mode by a first control signal (830) from an instruction memory (90);

an exclusive OR gate (93) that receives an output signal of said counter (91) at one input terminal and the lower address signal (725) from the Y address generation section (20) at the other input terminal;

a first multiplexer (94) that selects an output signal of said counter (91) in the sequential mode and the output signal of said exclusive OR gate (93) in the interleave mode by a second control signal (840) from the instruction memory (90); and a second multiplexer (95) that selects either an output signal of said first multiplexer (94) or the lower Y address signal (725) from the Y address generation section (20) in response to each bit of a third control signal (770) from the instruction memory (90).

2. The address pattern generator of claim 1 wherein each of said control signals from the instruction memory (90) is provided through a register which latches each of said control signals (850) from the instruction memory (90).

3. An address pattern generator used for testing a semiconductor memory device having an interleave mode and sequential mode of address access, comprising:

an instruction memory for storing address data and control signals and generates said address data and control signals in receipt of a sequential signal from a sequence controller;

an X address generator for generating a row address of said semiconductor memory device based on said address data from said instruction memory;

a Y address generator for generating a column address of said semiconductor memory device based on said address data from said instruction memory;

a counter for loading, as a preset value, lower address bits of said column address from said Y address generator in said sequential mode and a fixed value by a first control signal from said instruction memory in said interleave mode, said counter incrementing said preset value in synchronism with a system clock given to said semiconductor memory device;

an exclusive OR gate that receives an output signal of said counter at one input terminal and the lower address signal from the Y address generator at the other input terminal;

a first multiplexer that selects an output signal of said counter in the sequential mode and the output signal of said exclusive OR gate in the interleave mode by a second control signal from said instruction memory; and a second multiplexer that selects an output signal of said first multiplexer or the lower Y address signal from the Y address generator in response to each bit of a third control signal from the instruction memory.

4. An address pattern generator of claim 3 wherein said third control signal is provided to said second multiplexer through a register.

5. An address pattern generator of claim 3 wherein said semiconductor memory device is a synchronous DRAM (Dynamic Random Access Memory).

* * * * *